United States Patent [19]

de Loye et al.

[11] 4,228,467

[45] Oct. 14, 1980

[54] REDUCED REDUNDANCY FACSIMILE TRANSMISSION INSTALLATION

[75] Inventors: Martin de Loye, Versailles; Michel Beduchaud, Palaiseau, both of France

[73] Assignee: Compagnie Industrielle des Telecommunications Cit-Alcatel, Paris, France

[21] Appl. No.: 917,428

[22] Filed: Jun. 20, 1978

[30] Foreign Application Priority Data

Jun. 30, 1977 [FR] France ............................... 77 20078

[51] Int. Cl.³ ............................................. H04N 7/12
[52] U.S. Cl. ................................................. 358/261
[58] Field of Search ............... 358/133, 135, 136, 260, 358/261

[56] References Cited

U.S. PATENT DOCUMENTS

| | | | |
|---|---|---|---|
| 3,471,639 | 10/1969 | Centanni | 358/261 |
| 3,560,639 | 2/1971 | Centanni | 358/261 |
| 3,748,379 | 7/1973 | Epstein et al. | 358/261 |
| 4,092,675 | 5/1978 | Saran | 358/261 |
| 4,092,676 | 5/1978 | Saran | 358/261 |

Primary Examiner—Robert L. Griffin
Assistant Examiner—Joseph A. Orsino, Jr.
Attorney, Agent, or Firm—Sughrue, Rothwell, Mion, Zinn and Macpeak

[57] ABSTRACT

The invention relates to a reduced redundancy facsimile transmission installation which includes at the transmission end means which form run length words from the binary data analysis of a document.

In accordance with the invention, at the transmission end, an array of combinatorial logic circuits (26), preferably of the PLA type, is programmed to transcode run length words into other words, using a truncated Huffman code and, at the receiving end, arrays which are also preferably of the PLA type provide inverse transcoding.

Application: facsimile transmission.

4 Claims, 4 Drawing Figures

REDUCED REDUNDANCY FACSIMILE TRANSMISSION INSTALLATION

The present invention relates to an installation for the facsimile transmission of documents, in which a document is analysed by transmitter equipment to generating a facsimile signal; the facsimile signal is transmitted, for example, via a telephone line; and the analysed document is reproduced in receiver equipment on the basis of the transmitted facsimile signal.

In the transmitter equipment, the analysis of the document causes a digital signal to be generated whose successive bits correspond to the successive black or white dots detected along a scan line of the document. In the receiver equipment, the document is reproduced by an inverse process, i.e. from the received digital signal, by printing the black or white dots along each scan line of blank paper or of a blank document.

In an installation of this type, it is known to compress the digital analysis signal in order to transmit the facsimile signal in as short a time as possible. There is then a corresponding expansion in the receiver equipment to restore the analysis signal. A known means of compression consists in detecting, for each scan line, the black or white run lengths (i.e. series of bits which represent successive white dots or successive black dots) and in coding the detected run lengths. The digital signal after run length coding enables a first reduction in the time required for transmission of the contents of the document.

To avoid errors in the receiver unit when decoding to restore digital analysis signal, it is possible to adopt a run length code using words of the same length, each of which includes one bit which is significant of the type of run concerned (black or white). In this case, a long white run (or a long black run) can be divided into several successive white (or black) runs and can be coded in several words each including the same bit which is significant of the type of run concerned. It is also possible to adopt a run length code which uses words of variable length. In this case, each word expresses the run length to be transmitted and is accompanied by a prefix. The prefix can be a special word with a defined fixed format and can then indicate the beginning of a word. This prefix can also be a special word with a variable format (variable series of bits of the same level) and can then be significant of the number of bits contained in the word. The maximum length word then expresses the total number of dots making up a scan line and the variable format prefix which is associated with it will also include the highest number of bits.

In these installations and in particular in those which code the digital analysis signal, the document is analysed or restored in successive scan lines. One particular word is generated at each change of scan line, for example at the end of each scan line and this word is inserted in the digital analysis signal to form a synchronization signal.

The present invention aims at further reduction of the transmitted facsimile signal.

The present invention provides an installation for transmitting a facsimile signal of a document with reduced redundancy in transmission, the installation comprising a transmitter equipment and a receiver equipment; wherein the transmitter equipment comprises:

document analysis means for scanning a document in successive scan lines and delivering binary analysis data DA representative of the scan lines;

conversion means connected to receive the analysis data and to derive run length words therefrom representative of the number of consecutive bits of the same level in each scan line of the analysis data;

a first array of combinatorial logic circuits connected to receive the run length words and to transcode them into other binary code words which constitute transmission data DE;

the transmission data DE being encoded using a truncated Huffman code to provide both terminal code words and composition code words, where terminal code words accurately define the lengths of runs which are shorter than a defined limit, and where composition code words coarsely define, in terms of sections, the lengths of runs which are not shorter than the defined limit, such a run length being accurately defined by assigning both a composition code word and a terminal code word thereto; and transmission means for applying said transmission data DE in the form of a facsimile signal to a transmission medium;

and wherein the receiver equipment comprises:

means for receiving the facsimile signal transmitted by the transmitter equipment and deriving therefrom binary reception data DR corresponding to the transmission data DE which gave rise to the received facsimile signal;

a second array of combinatorial logic circuits connected to receive the reception data DR, to recognise the terminal code words and the composition code words therein, and to transcode these code words into run length words;

restitution means responsive to the run length words to restitute the analysis data; and a printer responsive to the analysis data to reproduce the analysed document.

The extra transcoding in the transmitter equipment allows the required reduction of redundancy to be obtained without increasing the danger of errors in the transmitted signal. Inverse transcoding in the receiver equipment allows the analysis data to be restituted for printing the document. Such transcoding is obtained by circuits which can easily be produced and allow transmitter and receiver equipments to be manufactured at reasonable cost.

An embodiment of the present invention is described by way of example with reference to the accompanying drawings, in which.

Figure 1:
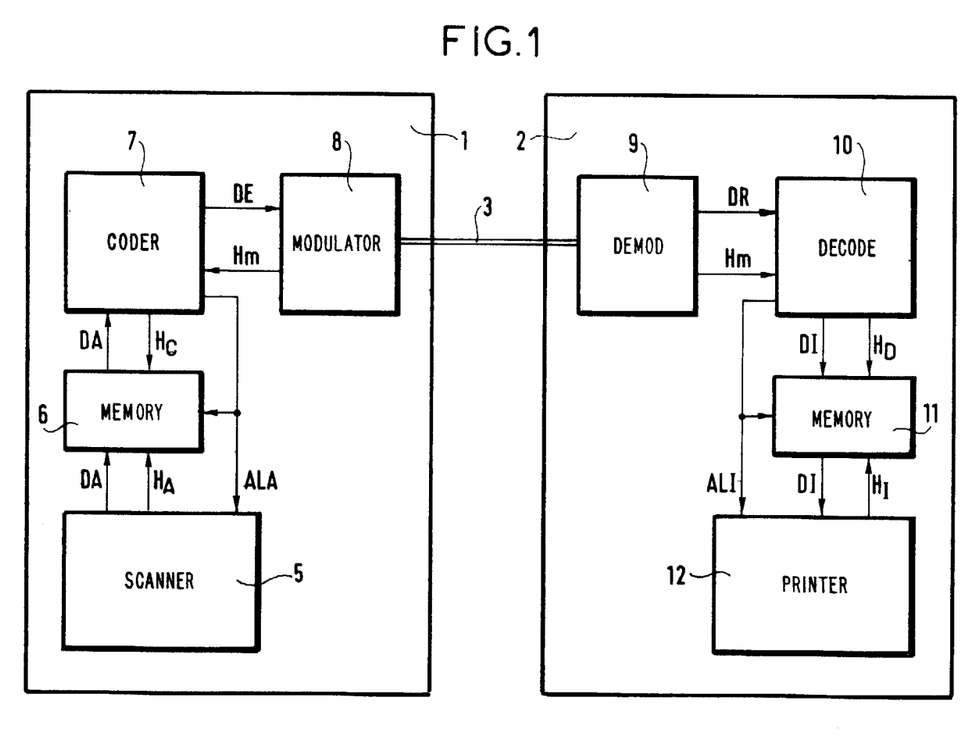
FIG. 1 shows the general organization of a facsimile transmission installation.

The facsimile transmission installation such as shown in FIG. 1 is in the form of a block diagram of a known type. Only some of the blocks are of a realization particular to the present invention. In accordance with the general organization of the installation shown in FIG. 1, it is seen that this installation comprises transmitter equipment 1, receiver equipment 2 and a remote connection 3, for example a telephone line, between the transmitter equipment and the receiver equipment.

The transmitter equipment 1 includes a document analysis device 5 of known type, generating a digital signal whose successive bits correspond to the successive dots scanned at the rate HA of an analysis clock (not shown) and detected as being black dots or white dots along a scan line of the document. The digital signal forms the analysis data DA and is transmitted to a memory assembly 6 at the rate of the analysis clock signal HA. This memory assembly 6 is connected to a coder 7 (described hereinafter) whose function is to reduce the amount of transmission data DE with respect to the amount of anlysis data DA which it receives from the memory assembly 6 at a variable rate HC determined by the coder. The coder 7 also emits a step-by-step control signal ALA which causes the analysed document to advance by one scan line. This same signal ALA is also applied to the memory assembly 6 as a control signal. A modulator-demodulator 8 receives the data DE emitted by the coder 7; this data DE is received at the rate Hm of a 2400 bits/sec clock of the modulator-demodulator 8, not shown. It causes a facsimile signal of the analysed document to be transmitted on the telephone line 3. Transmission on the telephone line is at the rate Hm (2400 bits/sec.). The receiver equipment 2 includes a modulator-demodulator 9 which receives the facsimile signal transmitted at the rate Hm and delivers the demodulated data or received data DR to a decoder 10 at the rate Hm given by an associated clock (not shown) and identical to that of the analogous circuit of the transmission equipment. The decoder 10 is described hereinafter; it restores the analysis signal from the received data DR. In response to the received data DR it delivers printing data DI which is applied to a memory assembly 11 at a rate HD determined by the decoder. The memory assembly 11 supplies the printing data DI to a printing arrangement 12 of known type at a rate HI determined by a printing clock (not shown). The printing data DI corresponds to the analysis data DA, the two respective rates HI and HA being given independently from each other by the printing and analysis arrangements. The printing arrangement 12 also receives step-by-step print line advance control signal ALI from the decoder 10. This same signal ALI is also applied as a control signal to the memory assembly 11.

Figure 2:
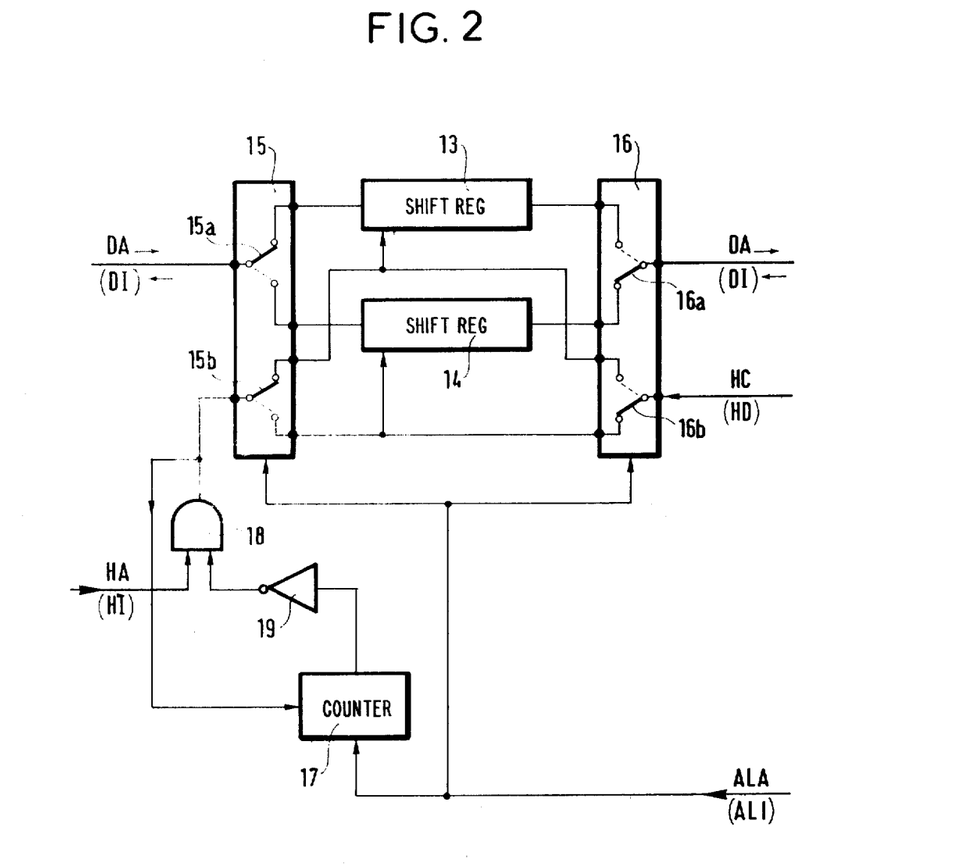
FIG. 2 shows in greater detail the arrangement of the buffer memories included in FIG. 1.

FIG. 2 shows the memory assembly used in the transmitter equipment and referenced 6 in FIG. 1; the memory assembly 11 used in the receiver equipment is analogous. The incoming data DA at its rate HA and the outgoing data at its rate HC are indicated therein for the transmitter equipment. The corresponding data and data rates for the receiver equipment are also indicated therein in brackets, with the incoming data DI at the rate HD and the outgoing data DI at the rate HI.

The memory assembly includes two buffer memories 13 and 14 each formed by a shift register with a capacity chosen equal to the number of dots per scan line of the document, for example 1728 dots. These two memories are connected to two switching arrangements 15 and 16, one of which is an input arrangement for the two memories and the other of which is an output arrangement for the two memories. Each of these switching arrangements is schematically represented by two switches 15a and 15b or 16a and 16b. One switch of each switching arrangement is for data transfer and the other for data shift pulses. One of the switching arrangements allows one of the memories to be loaded; the other allows the other memory to be read. This operation is interchanged at each scan line advance signal ALA (ALI) which is applied to control the switching arrangements 15 and 16. The memory assembly also includes an AND gate 18, and a counter 17 which detects the number of dots analysed (printed) along a scan line at the rate HA (HI) of the analysis (printing) signal clock. The counter receives the clock signal which gives the rate HA (HI) via the AND gate 18 which AND gate also receives (via an inverter 19) a signal delivered by the counter 17 and indicative of a detection of the total number of dots in a scan line (1728 dots). The counter 17 is set to zero by the scan line advance signal ALI. The output signal of the AND gate 18 is also applied to the switching arrangement 15 and controls the shifting of the memory for loading the incoming data DA (for reading the outgoing data DI). The clock signal which comes from the coder (decoder) at the rate HC (HD) is applied to the switching arrangement 16 and controls the shifting of the memories for reading outgoing data DA (for loading incoming data DI).

With reference to FIGS. 1 and 2, for the transmitter equipment, when the memory which is being loaded e.g. the memory 13, has received the data DA which corresponds to a complete line (1728 bits) at the rate HA, the counter 17 on reaching 1728 blocks the passage of the analysis clock signal at the rate HA by means of the AND gate 18. During this time, the memory 14 is read at the clock pulse rate HC which comes from the coder. When the signal ALA arrives, the functions of the memories are interchanged; the counter 17 is set to zero and the AND gate 18 again allows the clock signal HA to pass. For the receiver equipment, (with the memory which is being read being for example the memory 13) when the contents of a complete scan line (1728 bits) has been read at the rate HI of the printing clock, the counter 17 blocks the passage of the clock signal at the gate HI. by means of the AND gate 18. Meanwhile, the other memory 14 receives the data DI decoded at the rate HD of the decoder clock and becomes loaded. When the decoder emits the line advance signal ALI, the functions of the memories are interchanged to print a new line; the counter 17 is reset to zero and the clock signal at the rate HI again passes through the AND gate 18.

Figure 3:
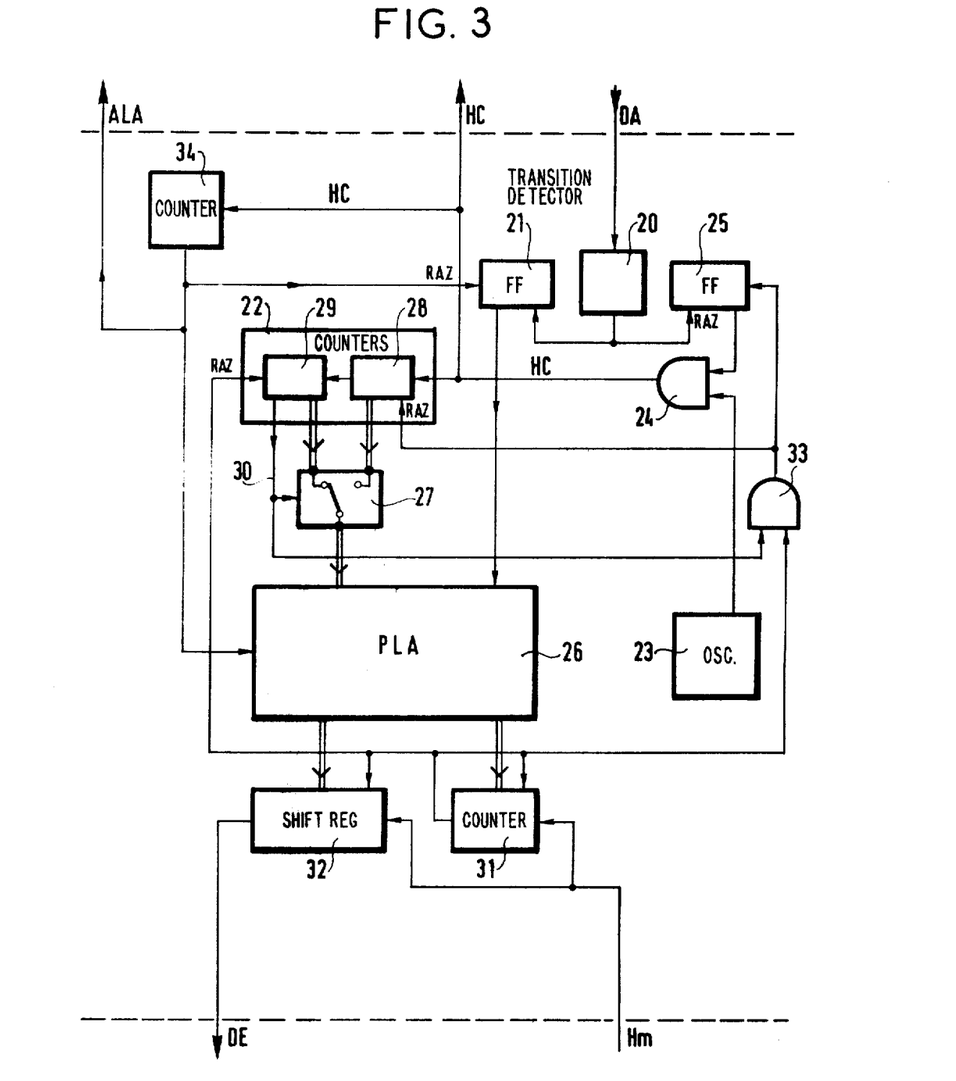
FIGS. 3 and 4 show the decoder and the coder included in FIG. 1.

FIG. 3 shows the coder referenced 7 in FIG. 1. It generates the clock rate HC at which rate it receives the bits of the data DA in the form of variable series of 1s alternating with variable series of 0s. This data is taken from one of the memories 13 and 14 in FIG. 2 and corresponds to the successive scan lines of the analysed document. The coder includes a transition detector 20 at whose input the data DA is applied. This transition detector 20 detects the changes from level 0 to level 1 and from level 1 to level 0 in the series of bits which form the data DA. It detects the changes in runs and controls counting of the lengths of alternate black and white runs defined by the data DA. For this purpose, the transition detector 20 is connected to a bistable 21 referred to as the colour bistable whose output state (0 or 1) is modified at each detection of a transition and is significant of the colour of the run defined by the data DA which is currently being received by the detector 20. The run lengths (independent of the colour which is defined by the bistable 21) are counted by a counting circuit 22 counting modulo 1728 for the analysis definition in question (1728 dots per scan line). The counting circuit 22 is connected via a logic AND gate 24 to an oscillator 23 which delivers a clock signal for example at 2 MHz. The AND gate 24 is controlled by a bistable 25 referred to as a blocking bistable which is intended to stop the count by blocking the clock signal of the oscillator 23 by means of the AND gate 24 when the run being measured has ended. The output of this bistable 25 is set to zero by the transition detector; its output is set to 1 by a control means as set forth hereinafter. The components 20 and 25 constitute means for converting the data DA into binary words referred to as run length words delivered at the outputs of the counting circuit 22.

The coder includes a set of combinatorial logic circuits 26 of PLA (programmable logic array) type connected via a switching circuit 27 to the counting circuit 22. The array of combinatorial logic circuits 26 is also connected to the output of the colour bistable 21 which provides it with the colour data of a measured run for processing. The array of combinatorial logic circuits (PLA) 26 will be constituted for example by circuits such as that manufactured under the reference IM 5200 by Intersil or those manufactured under any of the references DM 7575/DM 8575, DM 7576/DM 8576 by National Semiconductor. All the component circuits of the coder could be formed in a single integrated circuit manufactured specially for this purpose. In this case, the combinatorial logic circuits are defined by coding tables expressed in canonical form of sums and of logic products of input variables. The set of circuits 26 is programmed to transcode each of the run length words delivered by the circuit 22, as shown in table I hereinafter for the white detected runs and in table II for the black detected runs. For each run, the programmed array 26 deduces a word of variable length from the word it receives at its input which expresses in binary code the length of a measured run of a defined colour. The transcoding performed by this array, given in tables I and II, is a truncated Huffman code. As is apparent from tables I and II, this transcoding allows a reduction of redundancy firstly by assigning to the measured runs words of variable length which are different from one another for different run lengths and also different from one another for runs of same length but of different colours and secondly by ensuring that the greater the probability of a particular measured run length word occurring the shorter the code word assigned to it.

The correspondance between the length of each of the white and black runs of the data DA (expressed for simplicity's sake in decimal code and not in binary code in the tables) and the transcoded word, using this truncated Huffman code, is as follows:

TABLE I

| | | | white runs | | |
|---|---|---|---|---|---|
| Run length DA | Terminal code words DE | Run length DA | Terminal code words DE | Run length DA | Composition code words DE |
| 0 | 01011111 | 32 | 1101110 | 64 | 1010 |
| 1 | 00001 | 33 | 0111010 | 138 | 01100 |
| 2 | 1100 | 34 | 1101010 | 192 | 111010 |
| 3 | 0001 | 35 | 1111100 | 256 | 0111000 |
| 4 | 100 | 36 | 0101110 | 320 | 11111110 |
| 5 | 0010 | 37 | 11111011 | 384 | 11111010 |
| 6 | 0100 | 38 | 011011110 | 448 | 10111110 |
| 7 | 11100 | 39 | 01111110 | 512 | 110110110 |
| 8 | 01010 | 40 | 01101100 | 576 | 101111111 |
| 9 | 110100 | 41 | 01111111 | 640 | 111111110 |
| 10 | 111101 | 42 | 10111011 | 704 | 011011111 |
| 11 | 010110 | 43 | 01011110 | 768 | 001111110 |
| 12 | 001100 | 44 | 11011010 | 832 | 011010101 |
| 13 | 111100 | 45 | 10111010 | 895 | 1110111111 |
| 14 | 101100 | 46 | 011011011 | 960 | 1110111110 |
| 15 | 101101 | 47 | 001111100 | 1024 | 01101011101 |
| 16 | 0111100 | 48 | 001111111 | 1085 | 01101011100 |
| 17 | 0111110 | 49 | 110111101 | 1152 | 01101011110 |
| 18 | 0111101 | 50 | 110111100 | 1216 | 0110101111100 |
| 19 | 0011010 | 51 | 111011101 | 1280 | 0110101111110 |
| 20 | 1110110 | 52 | 111111111 | 1344 | 0110101111101 |
| 21 | 1011110 | 53 | 110111110 | 1408 | 01101011111110 |
| 22 | 1011100 | 54 | 001111101 | 1472 | 011010111111110 |
| 23 | 1111110 | 55 | 111011100 | 1536 | 0110101111111110 |
| 24 | 1101011 | 55 | 111011110 | 1600 | 01101011111111110 |
| 25 | 0011100 | 57 | 110111111 | 1664 | 01101011111111111 |
| 26 | 0011011 | 58 | 110110111 | 1728 | 0110100 |
| 27 | 0111011 | 59 | 101111110 | | |
| 28 | 0111001 | 60 | 011010100 | | |
| 29 | 0011110 | 61 | 011011010 | | |
| 30 | 1101100 | 62 | 011010110 | | |
| 31 | 0011101 | 63 | 011011110 | | |

TABLE II

| | | | black runs | | |
|---|---|---|---|---|---|
| Run length DA | Terminal code words DE | Run length DA | Terminal code words DE | Run length DA | Composition code words DE |
| 0 | 0011110111111011 | 32 | 0011110111100 | 64 | 00111111110 |
| 1 | 001100 | 33 | 0011111101100 | 128 | 00011111101 |
| 2 | 0010 | 34 | 0011111111100 | 192 | 0011110111110 |
| 3 | 10 | 35 | 0011111101110 | 256 | 00111111111010 |
| 4 | 01 | 35 | 0011110111010 | 320 | 00011111111010 |
| 5 | 110 | 37 | 0001111111100 | 384 | 00011110111010 |

TABLE II-continued

| \multicolumn{4}{c}{black runs} | | |
|---|---|---|---|---|---|
| Run length DA | Terminal code words DE | Run length DA | Terminal code words DE | Run length DA | Composition code words DE |
| 6 | 1110 | 38 | 0001111011100 | 448 | 000111111111110 |
| 7 | 00001 | 39 | 00111111011010 | 512 | 00111110111111 |
| 8 | 00010 | 40 | 00111111111110 | 576 | 001111011110110 |
| 9 | 11110 | 41 | 00111111011011 | 640 | 000111111111110 |
| 10 | 11111 | 42 | 00111101110110 | 704 | 001111111111110 |
| 11 | 001110 | 43 | 00111101110111 | 768 | 001111011111010 |
| 12 | 001101 | 44 | 00011110111100 | 832 | 001111111111111 |
| 13 | 000110 | 45 | 00011110111101 | 896 | 001111011111100 |
| 14 | 0001110 | 46 | 00011110111110 | 960 | 001111011111100 |
| 15 | 00111100 | 47 | 00111111011110 | 1024 | 001111011111010 |
| 16 | 001111100 | 48 | 00011111111100 | 1038 | 001111011111011 |
| 17 | 001111101 | 49 | 00011110111111 | 1152 | 001111011111100 |
| 18 | 001111010 | 50 | 00111111111100 | 1216 | 001111011111101 |
| 19 | 000111100 | 51 | 00011111111101 | 1280 | 001111011101010 |
| 20 | 000111110 | 52 | 00011111111011 | 1344 | 001111011101011 |
| 21 | 0011111110 | 53 | 00111111111101 | 1408 | 001111011011100 |
| 22 | 0011111100 | 54 | 00011110111011 | 1472 | 001111011011101 |
| 23 | 0011110110 | 55 | 00111111110111 | 1535 | 001111011011110 |
| 24 | 00111111010 | 56 | 00011111111111 | 1600 | 001111011011111 |
| 25 | 00011110101 | 57 | 00111111110110 | 1664 | 001111011111110 |
| 26 | 00011110100 | 58 | 00111110111110 | 1728 | 001111011111111 |
| 27 | 00011111110 | 59 | 00111101111110 | | |
| 28 | 00011111100 | 60 | 00111111111110 | | |
| 29 | 001111011100 | 61 | 00111101110101 | | |
| 30 | 000111101101 | 62 | 00111101111100 | | |
| 31 | 000111101100 | 63 | 00111101110100 | | |

In the coding performed by the array 26, measured run lengths of less than a defined length (64 bits in this case) are encoded by words referred to as terminal code words of the Huffman code, while runs of length greater than or equal to the defined length are encoded by words referred to as composition code words and derived in a manner described below. In order to perform this transcoding into composition code words (which correspond to runs measured in sections) and/or into terminal code words (which correspond to accurate measurement within a section or to accurate measurement of runs shorter than 64 bits in length) the counting circuit 22 is constituted by two counters: a first, modulo 64 counter, designated by the reference 28 receives the clock signal HC and counts between 0 and 63; and a second, modulo 27 counter designated by the referrence 29, which, for a single run of data DA received at the input of the coder 22, detects successive passages through zero of the modulo 64 counter 28 to which it is connected.

The two counters 28 and 29, connected to the array 26 via the switching circuit 27, allow, when a run of defined colour is measured, the composition word to be delivered first by taking into account the state of the modulo 27 counter 29, if the state of this counter is not zero. After the composition word has been formed, the coder forms the terminal word from the state of the modulo 64 counter 28. When the measurement of the length of a run of defined colour has no effect on the state of the modulo 27 counter 29 (run of less than 64 bits: state of the modulo 27 counter at zero), the terminal word is formed directly from the state of the modulo 64 counter.

For example: a black run whose length is 15 will be coded as 00111100;

a white run whose length is 15 will be coded as 101101;

a white run whose length is 356 will be coded as 111111100101110 (composition code word corresponding to the length 320 followed by the terminal code word corresponding to the length 36); and a white run whose length is 1728 will be coded 011010001011111 (composition word corresponding to the length 1728 followed by the terminal code word corresponding to the length 0).

For this transcoding into a terminal code word or into a composition code word followed by the appropriate terminal code word, the zero state of the modulo 27 counter 29 positions the switching circuit 27 on the outputs of the modulo 64 counter 28, while the non-zero state of the modulo 27 counter 29 positions the switching circuit 27 on the outputs of this counter 29 to take its state initially into account; this control of the switching circuit 27 is symbolized in FIG. 3 by a particular connection 30 between the counter 29 and the switching circuit 27 which transmits the data relating to the state of the counter 29 to the switching circuit.

The coding circuit also includes at the output of the array of combinatorial logic circuits 26 a presettable counter 31 and an output register 32 which are associated with each other. The output register 32 is a shift register which is loaded in parallel with the code word formed by the array 26 and clocked by the clock signal of the modulator-demodulator 8 (FIG. 1) at the rate Hm, to deliver the bits of the successive code words in series to form the transmitted data DE. The presettable counter 31 receives from the programmable logic array 26 the length or number of bits which make up each coded word (composition code word or terminal code word) and stores this number. The counter 31 receives the clock signal at the rate Hm and counts down during reading of the register 32 at the rate Hm. An output which delivers data significant of the zero state of the counter 31 is connected to the load control input of the output register 32 as well as to the presetting control input of the counter 31 for a new coded word. This output which gives the data significant of the zero state of the counter 31 is also connected to the modulo 27 counter 29 to set it to zero, if need be, and to an AND gate 33. The AND gate 33 is also connected to the connection 30 which gives data relating to the state of the modulo 27 counter 29. The AND gate 33 is conductive when the modulo 27 counter 29 and presettable counter 31 are simultaneously in the zero state. Its output is connected to the modulo 64 counter 28 to set it to zero and to the blocking bistable 25 to unblock it and hence to set its output in the state 1.

A modulo 1728 counter 34 for 1728 dots or analysis bits per scan line receives the clock signal of the coder at the rate HC. When it reaches 1728, the counter 34 delivers the line advance signal ALA. The output of the counter 34 is connected to the colour bistable 21 to reset it to zero: the bistable is thus initialized at each set of scan line data DA thereby causing the coder to begin systematically the processing of a defined run of colour, for example white (if, in fact, the first run happens to be black, the coder will process initially a white run whose length is 0). The output of the counter 34 is also connected to the programmable logic array 26; in response to received signal ALA the array 26 emits a special or line synchronization word, for example constituted by thirteen successive 0's followed by a 1.

In operation of the codes, when a run is measured by the counters 28 and 29, the transition detector 20 blocks the clock signal which comes from the oscillator 23 by means of the blocking bistable 25 and of the AND gate 24; the HC rate clock signal at the output of the AND gate 24 therefore includes "holes". The non-zero state of the modulo 27 counter 29 keeps the AND gate 33 and the bistable 25 blocked and therefore interrupts the HC rate clock signal of the coder. The data DA is no longer drawn from the memory assembly of FIG. 2. Due to the non-zero state of the modulo 27 counter 29, the switching circuit 27 is positioned on the outputs of this counter 29 whose state is thus applied to the programmable logic array 26. Meanwhile, the register 32, which is loaded with the terminal code word of the previously processed run, is being read at the rate Hm while the counter 31 which has been preset with the length of this code word is discharged at the same rate.

The return to zero of the counter 31 causes the register 32 to be loaded with the code word which corresponds to the state of the modulo 27 counter 29 and the length of this word to be stored in the presettable counter 31. The register 32 immediately delivers this new code word at the rate Hm, while the counter 31 counts down from its new preset value. Further, this return to zero of the counter 31 simultaneously resets the modulo 27 counter 29 to zero, thus positioning the switching circuit 27 on the outputs of the modulo 64 counter 28 whose state is thus applied to the programmable logic array 26.

When the counter 31 again reaches zero the code word which corresponds to the state of the modulo 64 counter 28 is loaded in the register 32 while the counter 31 stores the length of this new word. Also, the simultaneous zero state of the counters 31 and 29 opens the AND gate 33 which sets the modulo 64 counter 28 to zero and triggers the bistable 25. The HC rate clock of the coder is unblocked. The data DA is again drawn at the rate of HC from the memory assembly (FIG. 2) and a new run is measured. The register 32 is read at the rate Hm, while the counter 31 returns to zero to allow a new word to be received in the output register 32 and the data DE to be transmitted at the regular rate Hm. The rate HC (2 MHz with interruptions between runs) allows the transmission of the data DE at the regular rate Hm (2400 bits/sec.).

Figure 4:
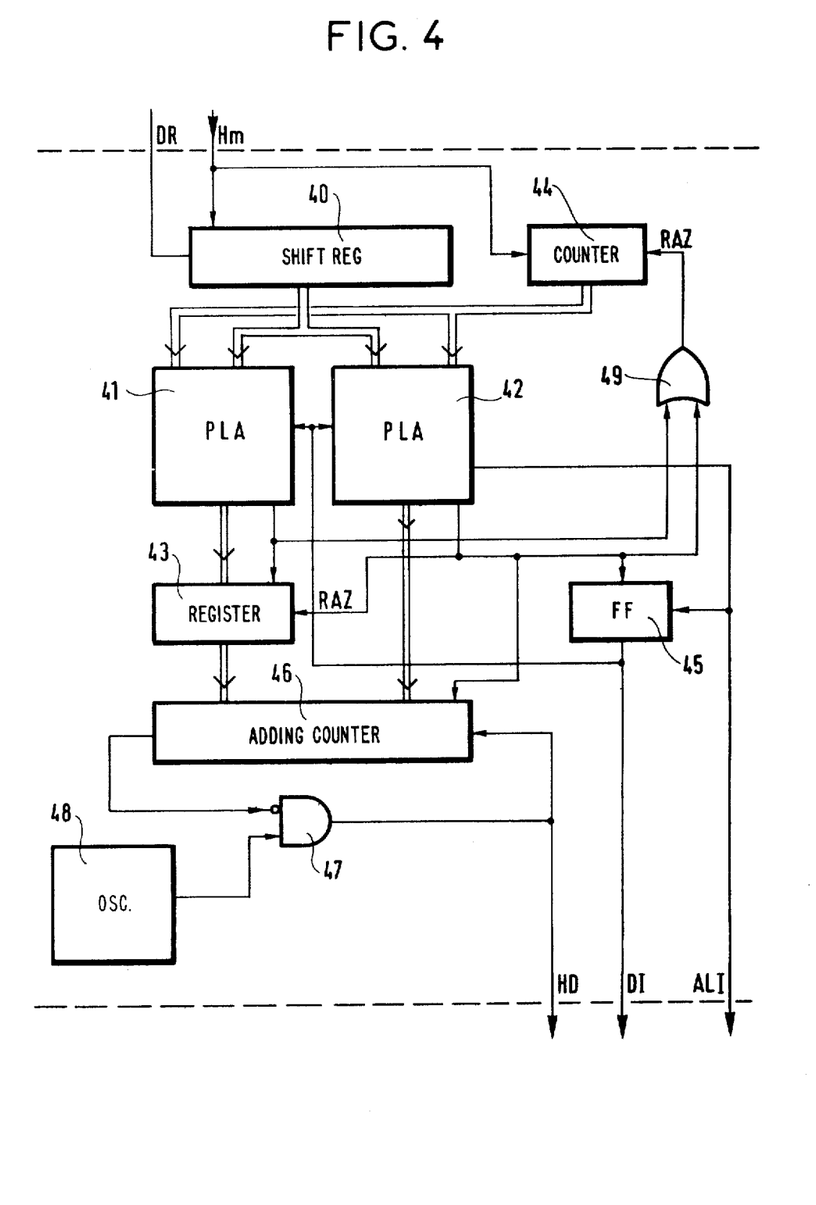

FIG. 4 shows the decoder referenced 10 in FIG. 1 which is intended to transcode in the inverse direction to that of the coder in FIG. 3. It receives at its input the data DR at the rate Hm of the clock of the modulator-demodulator to which it is connected. It includes an input register 40 which receives the data DR in series and is formed by a shift register clocked at the rate Hm. This input register 40 has its parallel outputs connected both to a first programmable logic array PLA 41 and to a second programmable logic array PLA 42. The array 41 is programmed to recognize composition code words and to transcode them into run length words. The array 42 is programmed to recognize terminal code words and to transcode them into run length words. Naturally the arrays 41 and 42 could be replaced by a single array programmed to recognise both composition code words and terminal code words and to transpose these code words into run length words.

A counter 44 connected to the count the Hm rate clock signal is associated with the register 40. The outputs of the counter 44 are connected to the combinatorial logic arrays 41 and 42. The counter 44 defines the length of the code word in the register 40 and supplies this information to the arrays 41 and 42.

The outputs of the array 41 are connected to a register 43 to apply there to firstly, in parallel, on a first set of inputs, the data in binary code which corresponds to the composition code word recognized and decoded and secondly, on a second input, a loading control signal generated when the code word is recognized. The register 43 thus receives the run length word which corresponds to the decoded code composition word. The outputs of the register 43 and the outputs of the array 42 are respectively connected to first and second groups of parallel inputs of a register circuit or presettable totalizing counter 46 whose maximum state, 1728, is equal to the number of dots per analysis or printing line. This counter 46 also has an input for a load control signal generated by the array 42 when a terminal code word is recognized by this array. When such a control signal is generated, the counter 46 receives, from the register 43, the run length word corresponding to the decoded composition code word and which expresses the measurement of the run in sections and, from the set 42, the run length word which corresponds to the decoded terminal code word and which expresses the accurate measurement of the run; it is then preset to the decoded run length. The load control signal applied to the presettable counter 46 is also applied to reset the register 43 to zero (RAZ); thus, when the array 42 recognizes a terminal code word without the array 41 having previously recognized a composition code word (which occurs when a run length is shorter than 64, the assembly 41 transmits a zero length section measurement to the counter 46 zero.

Both of the load control signals, one generated by the array 41 and applied to the register 43 and the other generated by the array 42 and applied to the counter 46, are applied to the reset to zero input RAZ of the counter 44 via an OR gate 49.

It should also be noted, that when the arrays 41 and 42 are constituted by a single array, the single array will decode a composition code word and apply it to the register 43 while waiting for the following terminal code word.

The counter 46 is also connected via an AND gate 47 to an oscillator 48, e.g. a 2 MHz oscillator. This AND gate 47 has an inverted input connected to the counter 46 for control from the non-zero state of this counter. The signal which comes from the AND gate 47 constitutes the HD rate clock signal of the decoder which is applied to the presettable counter 46, to make it count down to zero.

The load control signal applied to the presettable counter 46 is also applied to a bistable 45 referred to as a colour bistable which changes state at each new load control signal coming from the array 42. The output of the bistable 45 is connected to the arrays 41 and 42 to supply the colour data of the processed run thereto as defined by the word to be decoded. This colour bistable 45 is also reset to zero by an order which is applied to it by the array 42 from the synchronization word contained in the data DR and recognized by the array 42. This same order constitutes the printing line advance signal ALI supplied to the printing device.

The decoded data DI is obtained from the output of the colour bistable 45 and is applied to the input of the associated memory assembly which is controlled at the rate HD.

During operation, the colour bistable 45 is set to zero at the beginning of each printing scan line by the signal ALI. Systematically, the colour bistable is therefore preset for decoding the length of a run of a defined colour which is chosen at the time of coding (white page). The programmable logic arrays 41 and 42 receive this beginning of line colour data as well as the data DR at the rate Hm for recognizing successive code words and for decoding them. When a composition code word is decoded, the approximate length of the run (measured in sections) expressed in binary code is loaded into the register 43. The register 40 which is initially at zero receives the data D2 at the rate Hm; the state of the counter 44, which is also initially at zero, indicates the number of bits DR received by the register 40. The bits DR loaded in the register 40 are continuously applied to the arrays 41 and 42, as is the state of the counter 44 which defines the number of data bits DR present in the register 40. The state of the counter 44 is used to "activate" the inputs of the arrays 41 and 42 which correspond to data bits in the register 40. Thus for example if the four bits 0001 have been received in the register 40, the counter 44 is at state four and therefore ensures that only the least significant four input bits of the arrays 41 and 42 are "activated". When a terminal code word is decoded, the remainder of the section expressed in binary code (accurate measurement) is applied to the counter 46 which also receives simultaneously the contents of the register 43; also simultaneously the register 43 is reset to zero and the colour bistable 45 changes state; the bistable 45 supplies the data DI deduced from the restored runs to the printing device via the associated memorization assembly.

We claim:

1. An installation for transmitting a facsimile signal of a document with reduced redundancy in transmission; the installation comprising a transmitter equipment and a receiver equipment; wherein the transmitter equipment comprises:
   document analysis means for scanning a document in successive scan lines and delivering binary analysis data DA representative of the scan lines;
   conversion means connected to receive the analysis data and to derive run length words therefrom representative of the number of consecutive bits of the same level in each scan line of the analysis data;
   a first array of combinatorial logic circuits connected to receive the run length words and to transcode them into other binary code words which constitute transmission data DE;
   the transmission data DE being encoded using a truncated Huffman code to provide both terminal code words and composition code words, where terminal code words accurately define the lengths of runs which are shorter than a defined limit, and where composition code words coarsely define, in terms of sections, the lengths of runs which are not shorter than the defined limit, such a run length being accurately defined by assigning both a composition code word and a terminal code word thereto; and
   transmission means for applying said transmission data DE in the form of a facsimile signal to a transmission medium;
   and wherein the receiver equipment comprises:
   means for receiving the facsimile signal transmitted by the transmitter equipment and deriving therefrom binary reception data DR corresponding to the transmission data DE which gave rise to the received facsimile signal;
   a second array of combinatorial logic circuits connected to receive the reception data DR, to recognise the terminal code words and the composition code words therein, and to transcode these code words into run length words;
   restitution means responsive to the run length words to restore the analysis data;
   a printer responsive to the analysis data to reproduce the analysed document; and
   wherein said first array of combinatorial logic circuits is associated with a presettable counter and an output register for parallel to serial conversion of the transmission code data DE, both the counter and the output register being connected to load data in parallel form from the array when the counter is in its zero state, the output register being connected to receive a code word of the transmission data from the array and to deliver it in serial form to the transmission means at a transmission clock rate Hm, and the presettable counter being connected to be preset by the array to the length of the corresponding code word and to count down to the zero state at the transmission clock rate Hm.

2. An installation for transmitting a facsimile signal of a document with reduced redundancy in transmission; the installation comprising a transmitter equipment and a receiver equipment; wherein the transmitter equipment comprises:
   document analysis means for scanning a document in successive scan lines and delivering binary analysis data DA representative of the scan lines;
   conversion means connected to receive the analysis data and to derive run length words therefrom representative of the number of consecutive bits of the same level in each scan line of the analysis data;
   a first array of combinatorial logic circuits connected to receive the run length words and to transcode them into other binary code words which constitute transmission data DE;
   the transmission data DE being encoded using a truncated Huffman code to provide both terminal code words and composition code words, where terminal code words accurately define the lengths of runs which are shorter than a defined limit, and where composition code words coarsely define, in terms of sections, the lengths of runs which are not shorter than the defined limit, such a run length being accurately defined by assigning both a composition code word and a terminal code word thereto; and transmission means for applying said transmission data DE in the form of a facsimile signal to a transmission medium;

and wherein the receiver equipment comprises:

means for receiving the facsimile signal transmitted by the transmitter equipment and deriving therefrom binary reception data DR corresponding to the transmission data DE which gave rise to the received facsimile signal;

a second array of combinatorial logic circuits connected to receive the reception data DR, to recognise the terminal code words and the composition code words therein, and to transcode these code words into run length words;

restitution means responsive to the run length words to restore the analysis data; and a printer responsive to the analysis data to reproduce the analysed document;

wherein said first array of combinatorial logic circuits is associated with a presettable counter and an output register for parallel to serial conversion of the transmission code data DE, both the counter and the output register being connected to load data in parallel form from the array when the counter is in its zero state, the output register being connected to receive a code word of the transmission data from the array and to deliver it in serial form to the transmission means at a transmission clock rate Hm, and the presettable counter being connected to be preset by the array to the length of the corresponding code word and to count down to the zero state at the transmission clock rate Hm; and wherein the conversion means includes a transition detector which is connected to receive the analysis data DA at a rate of a coding clock HC and to detect changes of logical level therein, clock interrupt means responsive to the transition detector to interrupt the coding clock at each detected transition, a first bistable responsive to the transition detector controlled at each detected transition to change state to indicate the colour of each run to the logic array, a counter to count the coding clock pulses between interruptions of the coding clock to deliver run length words to the logic array, and clock enabling means arranged to act on the clock interrupt means to reset the counter to zero and to restart the coding rate clock when the counter total is less than the said defined limit and the said presettable counter is in the zero state.

3. An installation for transmitting a facsimile signal of a document with reduced redundancy in transmission; the installation comprising a transmitter equipment and a receiver equipment; wherein the transmitter equipment comprises:

document analysis means for scanning a document in successive scan lines and delivering binary analysis data DA representative of the scan lines;

conversion means connected to receive the analysis data and to derive run length words therefrom representative of the number of consecutive bits of the same level in each scan line of the analysis data a first array of combinatorial logic circuits connected to receive the run length words and to transcode them into other binary code words which constitute transmission data DE;

the transmission data DE being encoded using a truncated Huffman code to provide both terminal code words and composition code words, where terminal code words accurately define the lengths of runs which are shorter than a defined limit, and where composition code words coarsely define, in terms of sections, the lengths of runs which are not shorter than the defined limit, such a run length being accurately defined by assigning both a composition code word and a terminal code word thereto; and transmission means for applying said transmission data DE in the form of a facsimile signal to a transmission medium;

and wherein the receiver equipment comprises:

means for receiving the facsimile signal transmitted by the transmitter equipment and deriving therefrom binary reception data DR corresponding to the transmission data DE which gave rise to the received facsimile signal;

a second array of combinatorial logic circuits connected to receive the reception data DR, to recognise the terminal code words and the composition code words therein, and to transcode these code words into run length words;

restitution means responsive to the run length words to restore the analysis data;

a printer responsive to the analysis data to reproduce the analysed document;

wherein said first array of combinatorial logic circuits is associated with a presettable counter and an output register for parallel to serial conversion of the transmission code data DE, both the counter and the output register being connected to load data in parallel form from the array when the counter is in its zero state, the output register being connected to receive a code word of the transmission data from the array and to deliver it in serial form to the transmission means at a transmission clock rate Hm, and the presettable counter being connected to be preset by the array to the length of the corresponding code word and to count down to the zero state at the transmission clock rate Hm; and wherein said second array of combinatorial logic circuits is associated with a totalizing counter to apply said reconstituted run length words thereto at each recognition of a terminal code word, said totalizing counter being controlled for counting down at a decoding clock rate HD obtained from a constant rate clock which is interrupted by the zero state of said totalizing counter, and wherein said restitution means include a second bistable, controlled by the second array of combinatorial logic circuits to change its output state at each recognition of a terminal code word, the output state of said second bistable associated with the second array of combinatorial logic means to restore the analysis data at the rate HD of the decoding clock signal.

4. An installation according to claims 1, 2 or 3 wherein said arrays of combinatorial logic circuits are programmable logic arrays.

* * * * *